United States Patent [19]

Foo et al.

[11] Patent Number: 5,604,435
[45] Date of Patent: Feb. 18, 1997

[54] SPIRAL SCANNING METHOD FOR MONITORING PHYSIOLOGICAL CHANGES

[75] Inventors: Thomas K. Foo, Waukesha; Kevin F. King, New Berlin, both of Wis.

[73] Assignee: General Electric Company, Milwaukee, Wis.

[21] Appl. No.: 581,284

[22] Filed: Dec. 29, 1995

[51] Int. Cl.⁶ .................................................. G01V 3/00
[52] U.S. Cl. ........................................ 324/309; 324/307
[58] Field of Search ................................. 324/309, 307, 324/306, 312, 314, 300

[56] References Cited

U.S. PATENT DOCUMENTS

| Re. 32,712 | 7/1988 | Likes | 324/307 |
|---|---|---|---|
| 4,642,657 | 2/1987 | Kaplan | 324/309 |
| 4,651,096 | 3/1987 | Buonocore | 324/309 |
| 5,122,747 | 6/1992 | Riederer et al. | 324/309 |
| 5,133,357 | 7/1992 | Dumoulin et al. | 324/309 |
| 5,270,653 | 12/1993 | Pauly | 324/309 |
| 5,485,086 | 1/1996 | Meyer et al. | 324/309 |

OTHER PUBLICATIONS

King, Foo, & Crawford, "Optimized Gradient Waveforms for Spiral Scanning," MRM 34: 156–160 (1995).
Meyer et al, "Fast Spiral Coronary Artery Imaging," MRM 28: 202–213 (1992).
Hardy et al, "Broadband nuclear mag. res. pulses with two–dimentional spatial selectivity," J. Appl. Phys. 66(4), 1513–1516 (15 Aug.) 1989.
Ahn, et al, "High–speed Spiral Scan Echo Planar NMR Imaging–I," vol. MI–5, No. 1 (Mar. 1986).
Ljunggren, Stig, "A Simple Graphical Representation of Fourier–Based Imaging Methods," Journal of Mag. Res. 54, 338–343 (1983).

*Primary Examiner*—Louis M. Arana
*Attorney, Agent, or Firm*—James O. Skarsten; John H. Pilarski

[57] ABSTRACT

A method is provided for rapidly measuring change in $T_2^*$ in a region of an MR imaging subject, the method employing a double gradient echo sequence with spiral readout. In this technique, two gradient echoes are acquired after a single RF excitation. A first readout trajectory spirals out from the center of k-space, i.e., $k_r=0$, to some maximum radius, and then a second readout trajectory spirals back towards the center of k-space. A gradient echo is formed each time a k-space trajectory passes through the center of k-space. The signal intensity of the two echoes allows the calculation of the $T_2^*$ values on a pixel by pixel basis. The ability to measure changes in $T_2^*$ allows measurement of change in perfusion to be quantified.

11 Claims, 5 Drawing Sheets

SPIRAL SCANNING METHOD FOR MONITORING PHYSIOLOGICAL CHANGES

BACKGROUND OF THE INVENTION

The invention disclosed and claimed herein generally pertains to a method for measuring change in $T_2^*$, a parameter which is the combination of the spin-spin relaxation time and local magnetic field inhomogeneity effects, and parameters related thereto, in a subject of magnetic resonance imaging (MRI). More particularly, the invention pertains to a method of such type that employs a spiral scanning technique. This technique differs from conventional MRI imaging techniques in that in the acquisition of k-space data, data points are acquired along a spiral trajectory instead of a recti-linear trajectory.

The importance of measuring $T_2^*$ in biological systems is that it is known that the body's intrinsic contrast material, that of oxy and deoxy-hemaglobin has opposite effects on $T_2^*$. It has been proposed that in regions of increased metabolic activity, the body responds by increasing the blood flow to that specific region. As a result of the increased blood flow, there is a greater concentration of oxy-hemaglobin. As oxy-hemaglobin is diamagnetic, increased concentrations of oxy-hemaglobin has the effect of reducing the local magnetic field susceptibility, thus increasing the local $T_2^*$, resulting in increased signal intensity. Deoxy-hemaglobin is highly paramagnetic and has the effect of increasing the local magnetic field susceptibility and results in decreased $T_2^*$ (and subsequently, reduced signal intensity).

The increase in signal intensity as a result of increased perfusion or blood flow at the capillary level has been termed the BOLD effect or Blood Oxygenation Level Detection. This technique has been used to successfully detect metabolic activity in the brain without the use of exogeneous contrast agents. The use of BOLD allows repeated studies without the problems of having to wait for the body to purge itself of the exogeneous contrast agent.

In studies in the brain, there is less motion-related artifacts that tend to prevent accurate assessment of local perfusion. In the heart, cardiac and respiratory motion complicates the use of signal intensity changes to measure perfusion as partial volume effects, since motion of the excited region of tissue into and out of the region of interest would tend to alter the image signal intensity. Changes in the heart rate will also result in different degrees of signal recovery, changing image signal intensity from heart beat to heart beat.

As perfusion effects alter the tissue $T_2^*$, measurement of this parameter would provide a better method for assessing perfusion that is less sensitive to motion-related artifacts. As $T_2^*$ is a measure of the rate of decay of signal, it suffices to measure the signal change at two points in time. The absolute intensity may vary from heart beat to heart beat as the heart rate changes, but the rate of signal decay will remain unchanged. It is well known to those skilled in the art that the image signal intensity is given as:

$$S(t)=S_0 \exp(-t/T_2^*) \qquad \text{Equation 1}$$

where $S_0$ is a function of proton density and other pulse sequence parameters. In order to determine the $T_2^*$ value, we require two measurements of the signal intensity, each at a different time point. The $T_2^*$ value can be determined by dividing the signal intensity at the two time points such that:

$$S(TE_1)=S_0 \exp(-TE_1/T_2^*)$$

$$S(TE_2)=S_0 \exp(-TE_2/T_2^*) \qquad \text{Equation 2}$$

where $TE_1$ and $TE_2$ are the two different echo times. Dividing the signals at these two time points gives $$\exp((TE_2-TE_1)/T_2^*)=S(TE_1)/S(TE_2) \qquad \text{Equation 3}$$

taking the natural logarithm on both sides and rearranging gives $$T_2^*=(TE_2-TE_1)/\ln(S(TE_1)/S(TE_2)) \qquad \text{Equation 4}$$

By measuring the tissue $T_2^*$ in a pre-stressed or activity state, and again in a post-stressed or during some other activity, changes in $T_2^*$ as a result of metabolic activity and perfusion can be assessed. For example, $T_2^*$ could be measured in a subject at rest, and then measured later during physical or pharmacologically induced exertion. This technique would be less sensitive to errors as previously elaborated than using changes in the absolute signal intensity levels as an indicator of perfusion.

SUMMARY OF THE INVENTION

A method is provided for rapidly measuring tissue $T_2^*$ in a region of a subject in an MR imaging experiment or study. This technique employs a double gradient echo acquisition sequence in which image data at two different echo times are acquired after a single radio-frequency (RF) excitation pulse. By acquiring the two echoes after a single RF excitation pulse, we are able to measure the rate of signal decay on a pixel-by-pixel basis without significant partial volume effects from cardiac or respiratory motion. This avoids any inconsistencies where the two gradient echoes are acquired in separate intervals, with only one gradient echo acquired per RF excitation pulse.

The basis for the acquisition technique is a spiral imaging sequence where data from k-space is acquired in a spiral rather than the more conventional recti-linear trajectory. Such technique is described, for example, in U.S. Pat. Nos. 4,651,096, issued Mar. 17, 1987 to Michael H. Buanocare; 4,642,567, issued Feb. 10, 1987 to Jerome I. Kaplan; and 4,307,303, reissued Jul. 12, 1988 as Re.32,712 to Richard S. Likes and commonly assigned herewith. In k-space terminology, the image signal intensity is determined by the low spatial frequency data in k-space. Specifically, the data about the center of k-space determines image contrast.

In a spiral acquisition, the gradients in the logical x and y axis start from zero and increase in amplitude in a quasi-periodic fashion. This has the effect of a trajectory that starts from the center of k-space and spirals out to some maximum value. The time between the peak of the RF excitation pulse and the acquisition of data at the center of k-space constitutes the first echo time or $TE_1$, provided all zeroth gradient moments integrate to zero at this point.

It is a teaching of this invention that once the desired edge of k-space is attained, the gradient waveforms in the logical x and y directions are varied as a function of time so as to cause the traversal in k-space to begin spiralling back towards the center. At this later time when the zeroth gradient moments integrate to zero (at the center of k-space), a second gradient echo is formed at time $TE_2$. Measurements of the signal at these two time points allow a measurement of tissue $T_2^*$ on a pixel-by-pixel basis. Accurate determination of tissue $T_2^*$ by means of such measurement technique, of a subject in each of two different states, as referred to above, allows measurement of perfusion changes based on changes in tissue $T_2^*$ between the two different states.

More particularly, the method includes the step of applying RF excitation pulses selectively to a region lying within a subject in an MR imaging study that provides signal only from a section in the region. The above spiral acquisition pulse sequence is then implemented to acquire two gradient echo MR data sets, each at a different echo time as measured from the peak of the RF excitation pulse. Once adequate k-space data is acquired through either a single application of the RF excitation pulse (single-shot acquisition) or multiple applications of the RF excitation pulse (multi-shot acquisition), two separate images can be generated, with each image representing signal intensities in the object at the two different echo times. The differences in signal intensities on a pixel-by-pixel basis between these two images can be used to determine $T_2^*$ on a pixel-by-pixel basis based on Equation 4.

In this invention, data from the spiral trajectory outward from the center of k-space and the return inwards towards the center of k-space are separated into two data sets, with each data set representing the early and late echo images. It is disclosed that a portion of the data as k-space is traversed is made common to both data sets. In this manner, data acquisition time can be reduced. By reducing the data acquisition time, image blurring due to local magnetic field inhomogeneity effects and tissue off-resonance effects can be minimized.

In addition, a single spiral trajectory as described in the logical x-y plane can be rotated about the logical z axis to generate a traversal through different parts of k-space. By repeated rotations about the logical z axis and acquisition of k-space data in this fashion, the sampling density of k-space can be increased in a multiple acquisition or multi-shot fashion.

The manner in which the k-space trajectory is described by programming the gradient waveforms in the logical x and y axis can be varied to provide different k-space sampling strategies. This represents different embodiments of the invention with each embodiment having attendant features and benefits.

OBJECT OF THE INVENTION

An object of the invention is to provide an improved method for measuring tissue $T_2^*$ values in the body or like structures in a subject of an MR imaging study.

Another object is to measure the tissue $T_2^*$ values in a different biological state, that is in a state of rest and later in a state of activity. Differences in the activity state have the effect of changing tissue perfusion as the body reacts to greater demands of oxygen consumption as a result of increased metabolic activity.

Another object is to provide a method for measuring such perfusion changes in order to assess the amount of blood flow at the capillary level to a particular tissue site in a subject of an MR imaging study.

Another object is to provide an MR method for measurements of the above type which are particularly useful in connection with cardiac and brain structures.

Another object is to provide a method of the above type wherein spiral image acquisition is employed to acquire two successive MR images of a section in a subject after a single RF excitation pulse, with each image acquired at a different time point or echo time such that the time constant of the rate of decay in signal intensity ($T_2^*$) can be measured by comparing data from the two images.

Another object is to provide a method of the above type wherein the two measurements are acquired in a single sequence in order to avoid errors in measurement from cardiac or respiratory motion-related artifacts or the like, where signal intensity differences in $S_0$ between the two measurements in Equation 2 from one sequence to the next would contribute to errors in the measurement of $T_2^*$.

BRIEF DESCRIPTION OF THE DRAWINGS

FIG. 5a shows the X- and the Y-gradient waveforms for implementing the modification of FIG. 4a.

DETAILED DESCRIPTION OF THE PREFERRED EMBODIMENT

Spiral scanning has previously been described, such as in the patents referenced above, as an alternative method for the acquisition of k-space data that is necessary to generate an image. Spiral scanning techniques already disclosed sample data in k-space along a spiral trajectory starting from the center of k-space and ending at some k-space edge, the position of which is determined by the image spatial resolution desired.

Figure 1:
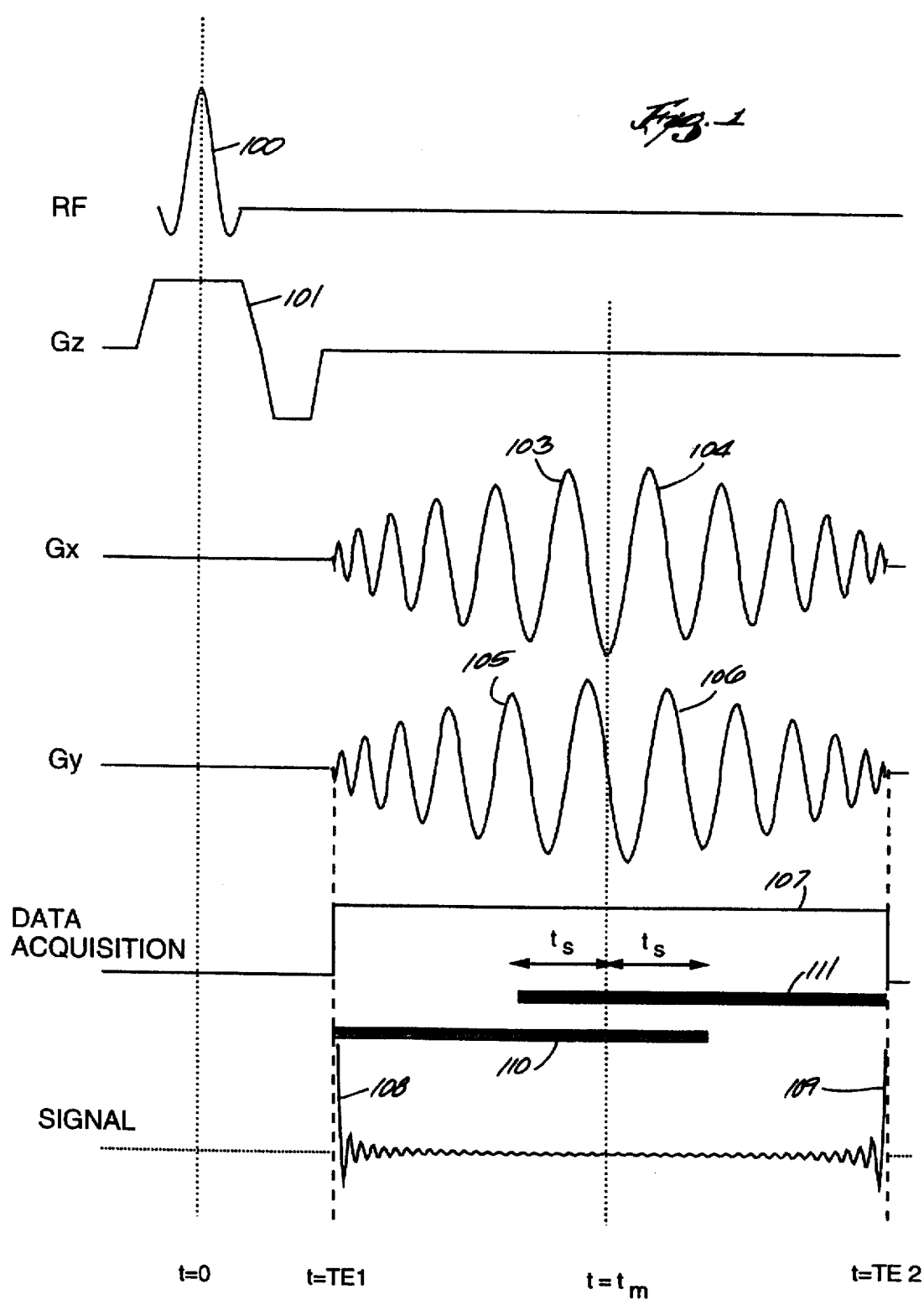
FIG. 1 shows a set of waveforms for an MR sequence comprising an embodiment of the invention.

Referring to FIG. 1, there is shown a set of waveforms for a spiral scan imaging sequence which comprises a single slice selective RF excitation pulse and logical x, y, and z gradient waveforms, labeled Gx, Gy, and Gz, respectively. Preferably, the RF excitation pulse is either spectrally and spatially selective or is preceded by a spectrally selective RF saturation pulse to selectively suppress protons associated with fat. This is to minimize image artifacts from chemical shift. FIG. 1 also shows a data acquisition period and the MR signal during such period. The sequence of FIG. 1 departs from prior art spiral scanning in accordance with the invention, as described hereinafter in greater detail.

Figure 3:
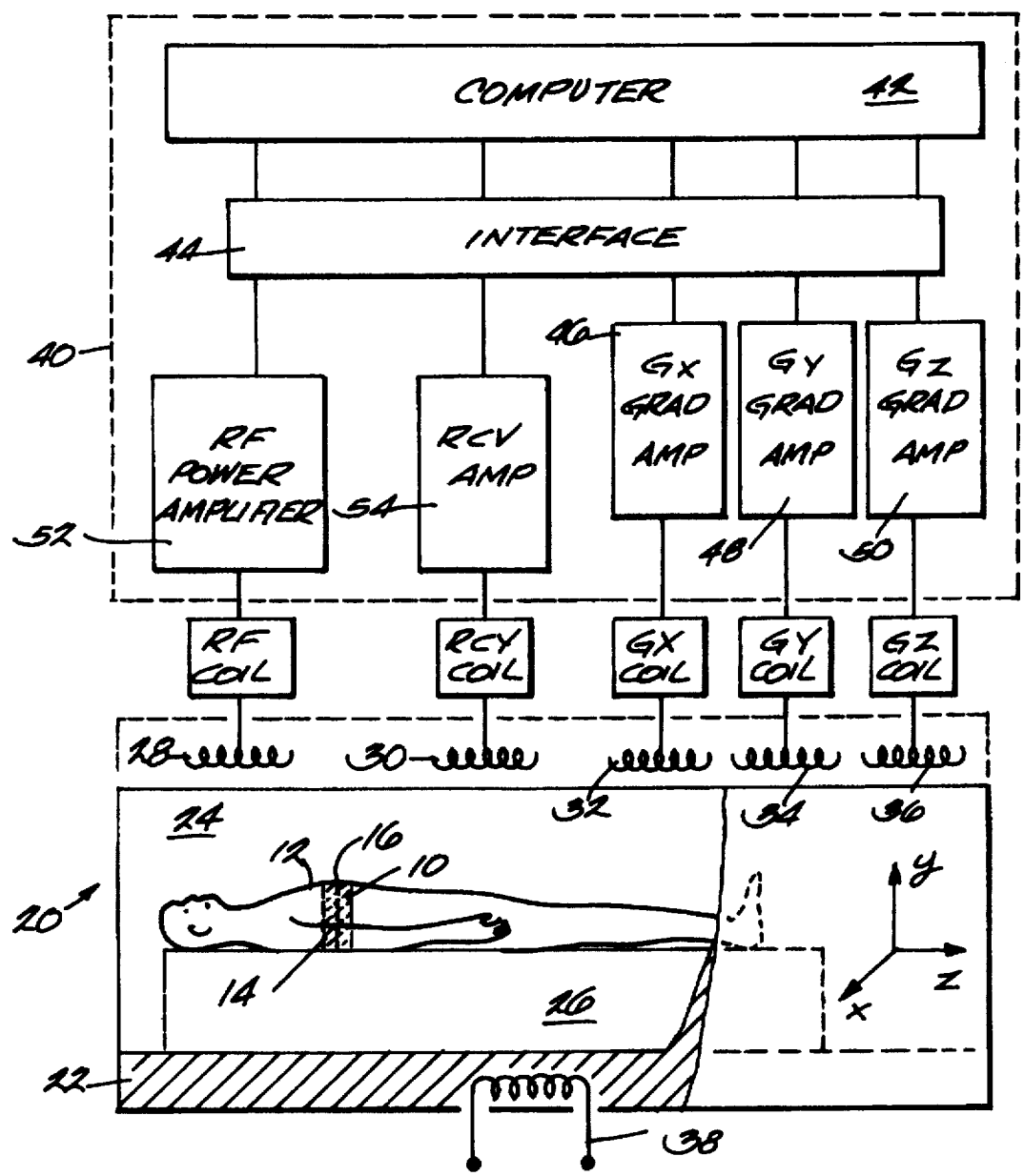
FIG. 3 is a diagram showing components for an MR imaging system for use in connection with the embodiment of FIG. 1.

The sequence shown in FIG. 1 commences with the slice selective RF excitation pulse 100 that excites spins contained within a specified region 10 of a patient or any other subject 12 in an MR imaging study, as shown in FIG. 3. For purposes of illustration, FIG. 1 shows a z-gradient waveform 101 that constitutes a slice selective waveform that is used in connection with the RF excitation pulse. This is a conventional slice selective RF excitation pulse and associated gradient waveform and can be easily substituted with a spectrally and spatially selective RF excitation pulses and its unique associated z-gradient waveforms. A planar section or slice 16, shown in FIG. 3 to be taken through cardiac structure 14, is thereby selected for imaging, in accordance with well known conventional practice. The slice 16 is an axial slice, i.e. it is orthogonal to the Z-axis, and accordingly is in or is parallel to the X-Y plane. However, by selection of other gradient waveforms, in a manner well known in the art, a planar section having a different orientation could readily be selected. For example, in accordance with a technique known as oblique imaging, a plane could be selected which intersected the Z-axis in non-orthogonal relationship, i.e., which is tilted from the X-Y plane.

Figure 2:
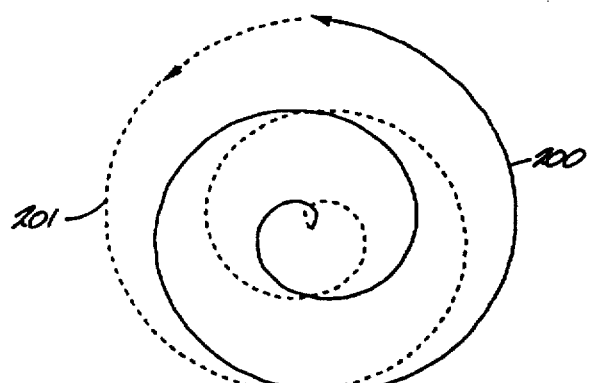
FIG. 2 is a k-space diagram showing first and second spiral scanning trajectories for the embodiment of FIG. 1.

Referring further to FIG. 1, there is shown a first echo 108 in the MR signal occurring at time $TE_1$ after the peak of the RF excitation pulse. As is well known, a gradient echo occurs when the zeroth moments or area of all active gradients integrate to zero. At time $TE_1$, data acquisition commences, during the period 107, whereupon the MR signal is sampled to acquire the first set of data points corresponding to the first echo image, and is represented in FIG. 1 by block 110. Coincident with the start of the data acquisition period, oscillating readout gradient waveforms applied in the logical x (103 and 104) and y (105 and 106) directions are generated. The gradient waveforms are generated such that the integral of the gradient area in the respective x and y directions corresponds to the k-space position in the $k_x$ and $k_y$ directions. The amplitude and the value of the gradient waveforms in time are chosen in accordance to practice in order to generate a spiral trajectory in k-space with data samples acquired with constant linear velocity. That is, the data samples are acquired at constant intervals along the spiral trajectory. The trajectory 200, as shown in FIG. 2, spirals outwards from the center of k-space, that is $(k_x, k_y)=(0,0)$ in a cartesian coordinate system or $(k_r, K_2)=(0,0)$ in a polar coordinate system, until a maximum radius, $k_r=K_{max}$ is attained at time $t=t_m$.

Following time $t=t_m$, data acquisition continues. At this point, the maximum k-space radius is reached and the gradient waveforms are varied in a manner such that the k-space trajectory begins an inward spiral back towards the center of k-space as shown by trajectory 201 in FIG. 2, where a second echo 109 is formed when the active gradient waveforms again integrate to zero at the center of k-space. In conventional practice, data acquisition for the first echo 108 is taken from time $t=TE_1$ to time $t=t_m$. Data for the second echo 109 is then taken from $t=t_m$ to time $t=TE_2$.

In contrast to conventional practice, the invention teaches that data for the first echo is taken from time $t=TE_1$ to time $t=t_m+t_s$, as shown in block 110 in FIG. 1. Similarly, data for the second echo 109 is taken from time $t=t_m-t_s$ to time $t=TE_2$, as shown in block 111 in FIG. 1. It is to be noted that the data acquired between $t=t_m-t_s$ and $t=t_m+t_s$ is common to the first echo 108 and the second echo 109 (and also to data blocks 110 and 111).

A useful feature of this embodiment is that data acquisition for the first echo 108 continues even as the spiral trajectory begins its journey towards the center of k-space. In the embodiments to be described, hereinafter, in connection with FIGS. 4 and 5, the return spiral trajectory may take a different path. Hence, the continuation of data acquisition as the trajectory returns towards the center of k-space serves to increase the sampling density of k-space for the first echo 108. This can have the effect of improving the interpolation of the spiral data to a recti-linear grid and also to minimize edge or detail blurring in the image as a result of inconsistencies in the expected k-space trajectory at the high k-space values caused by static magnetic field inhomogeneity effects and off-resonance effects.

If nominally 1500 data samples are acquired from time $t=TE_1$ to time $t=t_m$ and 1500 data samples are acquired from $t=t_m-t_s$ to time $t=TE_2$, the number of samples available to the early echo image 108 and the late echo image 109 can be increased by 500 data samples. By sharing the data acquired between $t=t_m-t_s$ and $t=t_m+t_s$, each data block 110 and 111 will now have 2000 data samples and increased sampling density of k-space without having to increase the data acquisition time or increasing the total number of data samples acquired when the data acquisition window 107 is enabled. Note that unlike conventional acquisition schemes, if 2000 data samples are desired per gradient echo image, a total of 4000 data samples need to be acquired. However, in this invention, only 3000 data samples need to be acquired and the sharing of data between the two data acquisition blocks 110 and 111 facilitates having 2000 data samples per gradient echo per sequence.

It is known to those skilled in the art that image blurring from off-resonance and relaxation effects can be minimized by keeping the data acquisition period 107 as short as possible. It is a teaching of this invention that we are able to accomplish the goal of keeping the data acquisition period to a minimum and yet sample k-space with adequate sampling density.

FIG. 3 shows principal components of an MR imaging system 20, useful for practicing the embodiment of the invention described above, as well as modifications thereof. System 20 includes a main magnet 22 provided with a bore 24, the MR subject 12 positioned therein on a support 26 for MR imaging of the structure 14, referred to above. MR system 20 further includes an RF excitation coil 28, a receive coil 30, $G_x$, $G_y$ and $G_z$ gradient coils 32, 34 and 36, respectively, and a static main magnet coil 38. All of the coils 28 and 32–38 are incorporated into magnet 22 so that when energized, they project the respective magnetic fields shown in FIG. 1 into bore 24, and more specifically into region 10 of the subject 12. Receive coil 30 is likewise incorporated into magnet 22, to detect or acquire respective data points of the data sets $S_1(x, y)$ and $S_2(x, y)$.

Referring further to FIG. 3, there is shown MR system 20 further comprising system electronics 40, which include a computer 42 interactively coupled to an interface 44. Components of MR system 20 further include gradient amplifiers 46, 48 and 50, which are each coupled to computer 42 through interface 44, and respectively energize the Gx, Gy and Gz gradient coils 32, 34 and 36. Thus, computer 42, through gradient amplifiers 46 and 48, drives the $G_x$ and $G_y$ gradient coils to generate the oscillating read gradients, as shown in FIG. 1, to perform spiral scanning. System electronics 40 further includes an RF power amplifier 52, coupled to energize RF excitation coil 28 to produce the RF pulse, and a receive amplifier 54, which amplifies respective MR data samples detected by receive coil 30, and couples them to computer 42.

As is well known, a single coil can be substituted for RF excitation coil 28 and receive coil 30. In such modification, a switching mechanism (not shown) is provided to alternately couple excitation amplifier 52 and receive amplifier 54 to such single coil. It is to be understood that system electronics 40 is likely to include other components which are not shown for purposes of simplification.

After the end of data acquisition, the computer 42 separates the data acquired from time $t=TE_1$ to $t=TE_2$ into data blocks 110 and 111. The computer further sorts the data acquired and copies the data acquired from time $t=t_m-t_s$ to $t=t_m+t_s$ into blocks 110 and 111. This then generates two data blocks 110 and 111, corresponding to the early echo 108 image and the late echo 109 image, respectively.

Figure 4A:
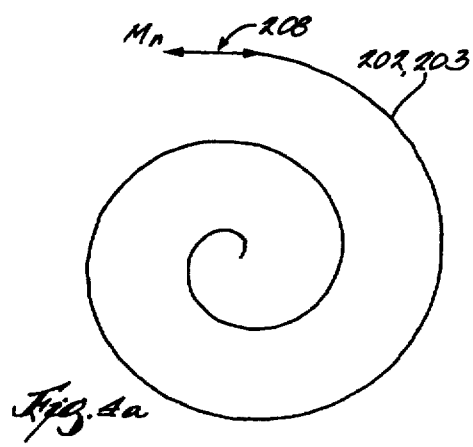
FIG. 4a shows k-space trajectory for a first modification of the embodiment of FIG. 1.

Referring to FIG. 4(a), there is shown a modification of the invention comprising two spiral trajectories 202 and 203 in k-space. The modification shown in FIG. 4(a) is substantially the same as the embodiment of the invention described above in connection with FIGS. 1 and 2, except for spiral trajectory 203. Thus, the trajectories 202 and 203 respectively correspond to first and second sets of data, and trajectory 202 spirals outward from the center of k-space, at a time $TE_1$, to a maximum radius $M_r$, reached at the time $T_m$. Thereupon, sampling of data commences along trajectory 203, which spirals inwardly from the maximum radius, back to the center of k-space at time $TE_2$. However, unlike continuous trajectory 201, the spiral trajectory 203 coincides with, or retraces, spiral trajectory 202.

Segment 208 in FIG. 4(a) denotes the intermediate trajectory in k-space between the end of the outbound spiral trajectory 202 and the beginning of the inbound spiral trajectory 203. The path taken by k-space segment 208 may vary as a function of MR system performance characteristics (i.e., maximum gradient slew rate) or an optional additional sequence deadtime to increase the time of the second echo 109 at $t=TE_2$. However, different paths that may be taken by k-space segment 208, the end points of this intermediate k-space segment remains unchanged. The different paths taken by k-space segment 208 may also be chosen to sample different regions of k-space to improve the k-space sampling density and improve image resolution.

Figure 5A:
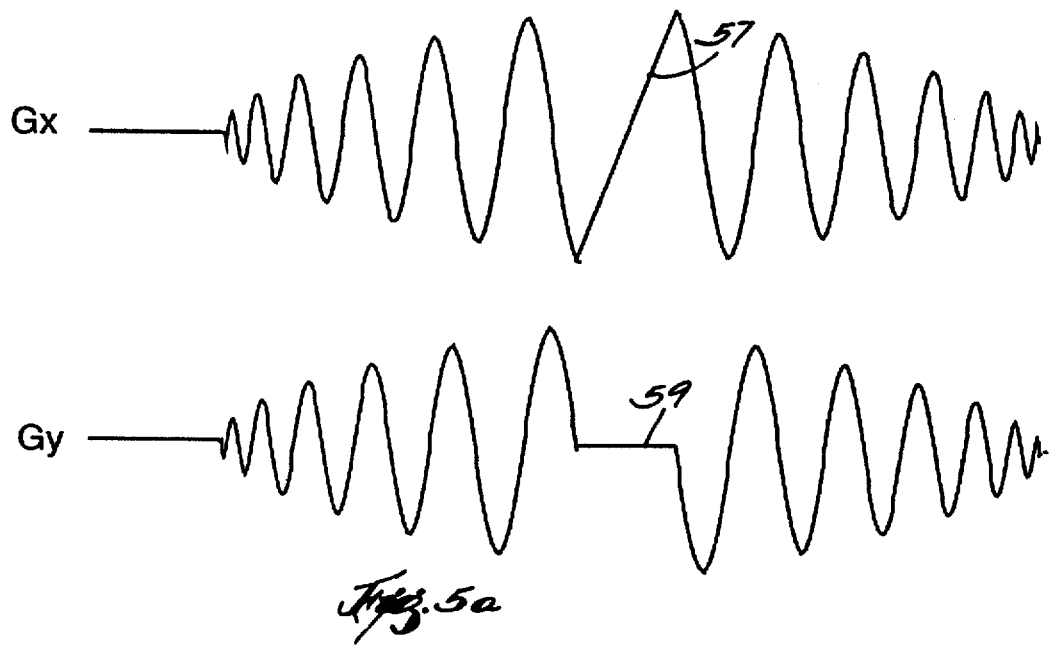

The spiral retrace modification of FIG. 4(a) may be implemented by replacing the $G_x$ gradient waveform shown in FIG. 1 with the $G_x$ waveform shown in FIG. 5(a). Such waveform is similar to $G_x$ of FIG. 1, except that a gradient ramp 57 is inserted between the two oscillating components of such waveform which respectively correspond to the outward and inward spiraling trajectories. Retrace trajectory 203 is attained by playing out the inwardly spiraling $G_x$ component with a negative gradient amplitude.

The modification of FIG. 4(a) is further implemented by replacing the $G_y$ gradient shown in FIG. 1 with the $G_y$ gradient shown in FIG. 5(a). Such waveform is similar to $G_y$ of FIG. 1 except that a constant gradient of zero amplitude 59 is inserted between the two oscillating components of such waveforms, which respectively corresponds to the inner and outer trajectories.

In the modification of FIG. 4(a), a portion of the data acquired on trajectories 202 and 203 is shared with both first and second data sets, in like manner with the embodiment described above in connection with FIGS. 1 and 2.

Figure 4B:
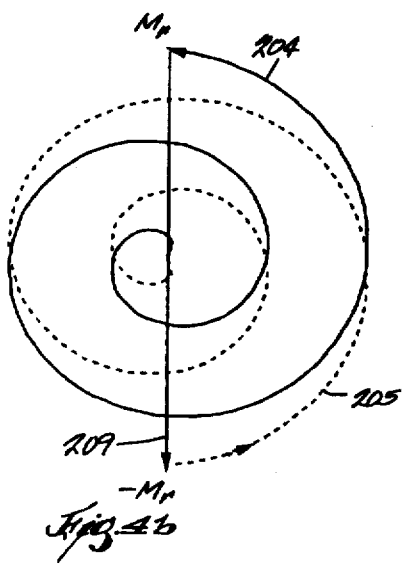
FIG. 4b shows the k-space trajectory for a second modification of the embodiment of FIG. 1.

Referring to FIG. 4(b), there is shown a modification of the invention comprising two spiral trajectories 204 and 205. The modification shown in FIG. 4(b) is substantially the same as the embodiment of the invention described above in connection with FIGS. 1 and 2, except for spiral trajectory 205. Thus, the trajectories 204 and 205 respectively correspond to the first and second sets of data, and trajectory 204 spirals outward from the center of k-space at a time $TE_1$, to a maximum radius $M_r$ reached at the time $T_m$. Thereupon, sampling of data commences along trajectory 205. Trajectory 205 spirals inwardly in the same direction as Trajectory 204, but from a maximum radius which is the negative of the maximum radius reached by the trajectory 204, i.e., from $-M_r$. Trajectory 205 spirals back to the center of k-space at a time $TE_2$. Thus, as shown by FIG. 4(b), the spiral trajectories 204 and 205 are interleaved, to increase k-space density.

Figure 5B:
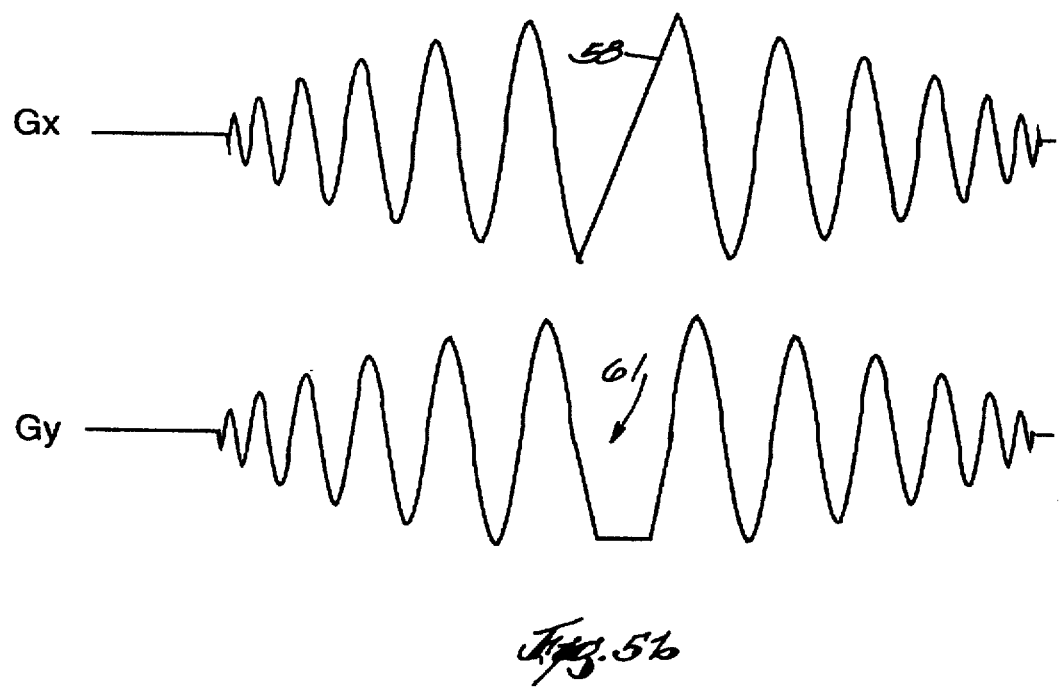
FIG. 5b shows the X- and the Y-gradient waveforms for implementing the modification of FIG. 4b.

The continuous direction of interleaved modification of FIG. 4(b) may be implemented by replacing the $G_x$ gradient waveform shown in FIG. 1 with the $G_x$ waveform shown in FIG. 5(b). Such $G_x$ waveform is similar to $G_x$ of FIG. 1, except that a gradient ramp 58 is placed therein as noted and described for FIG. 5(a).

The modification of FIG. 4(b) is further implemented by replacing the $G_y$ gradient of FIG. 1 with the $G_y$ gradient shown in FIG. 5(b). Such waveform is similar to $G_y$ Of FIG. 1, except that a trapezoidal waveform 61 is inserted between the two oscillating components of such waveform which respectively correspond to the outward and inward spiraling trajectories.

Segment 209 in FIG. 4(b) denotes the intermediate trajectory in k-space between the end of the outbound spiral trajectory 204 and the beginning of the inbound spiral trajectory 205. The path taken by k-space segment 209 may vary as a function of MR system performance characteristics (i.e., maximum gradient slew rate) or an optional additional sequence deadtime to increase the time of the second echo 109 at $t=TE_2$. However, different paths that may be taken by k-space segment 209, the end points of this intermediate k-space segment remains unchanged. The different paths taken by k-space segment 209 may also be chosen to sample different regions of k-space to improve the k-space sampling density and improve image resolution.

Figure 4C:
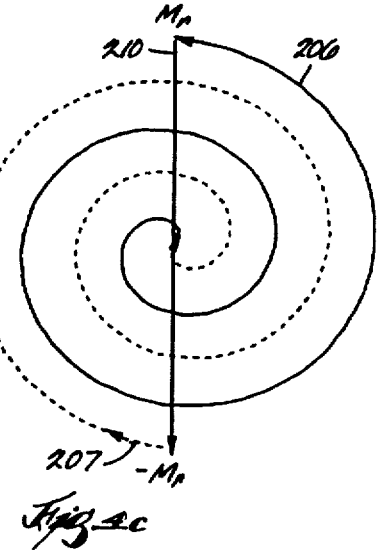
FIG. 4c shows the k-space trajectory for a third modification of the embodiment of FIG. 1.

In the modification of FIG. 4(b), a portion of the data acquired on trajectories 204 and 205 is shared with both first and second data sets, in like manner with the embodiment described above in connection with FIGS. 1 and Referring to FIG. 4(c), there is shown a modification of the invention comprising two spiral trajectories 206 and 207 in k-space. The modification shown in FIG. 4(c) is substantially the same as the embodiment of the invention described above in connection with FIGS. 1 and 2, except for spiral trajectory 207. Thus, the trajectories 206 and 207 respectively correspond to first and second sets of data, and trajectory 206 spirals outward from the center of k-space, at a time $TE_1$, to a maximum radius $M_r$ reached at the time $T_m$. Thereupon, sampling of data commences along trajectory 207, which spirals inwardly. As with trajectory 205 shown in FIG. 4(b), trajectory 207 commences from a maximum k-space radius $-M_r$. However, the direction of the trajectory 207 is opposite to the direction of trajectory 206. Thus, trajectories 206 and 207 collectively comprise a true interleaved spiral.

Figure 5C:
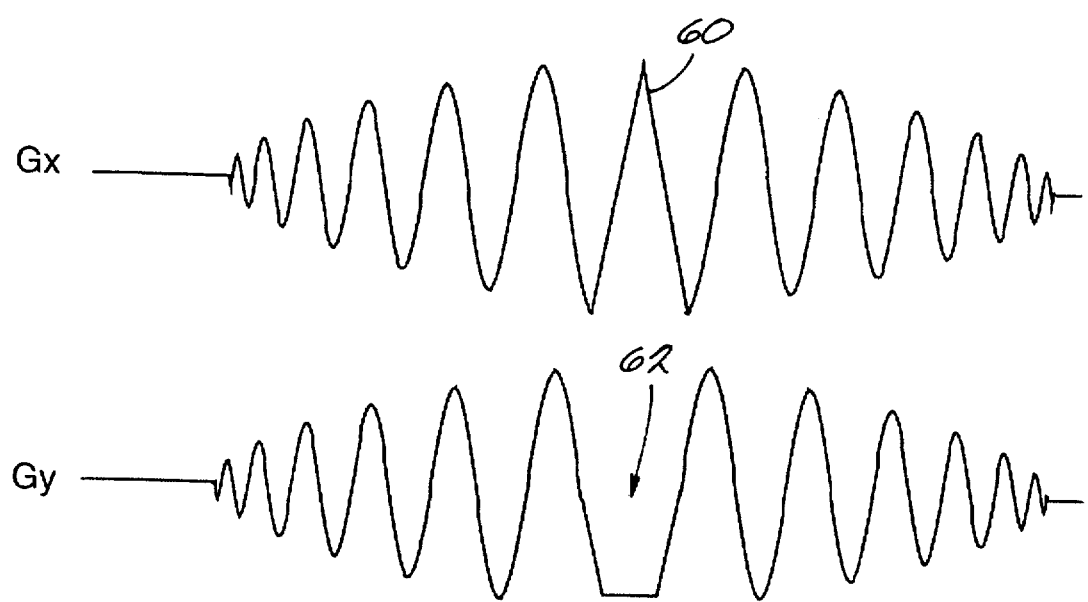
FIG. 5c shows the X- and the Y- gradient waveforms for implementing the modification of FIG. 4c.

The spiral retrace modification of FIG. 4(c) may be implemented by replacing the $G_x$ gradient waveform shown in FIG. 1 with the $G_x$ waveform shown in FIG. 5(c). Such waveform is similar to $G_x$ of FIG. 1, except that a gradient triangle of zero net area 60 is inserted between the two oscillating components of such waveform which respectively correspond to the outward and inward spiraling trajectories.

The modification of FIG. 4(c) is further implemented by replacing the $G_y$ gradient shown in FIG. 1 with the $G_y$ gradient shown in FIG. 5(c), as noted and described for FIG. 5(b).

Segment 210 in FIG. 4(c) denotes the intermediate trajectory in k-space between the end of the outbound spiral trajectory 206 and the beginning of the inbound spiral trajectory 207. The path taken by k-space segment 210 may vary as a function of MR system performance characteristics (i.e., maximum gradient slew rate) or an optional additional sequence deadtime to increase the time of the second echo 109 at $t=TE_2$. However, different paths that may be taken by k-space segment 210, the end points of this intermediate k-space segment remains unchanged. The different paths taken by k-space segment 210 may also be chosen to sample different regions of k-space to improve the k-space sampling density and improve image resolution.

In the modification of FIG. 4(c), a portion of the data acquired on trajectories 206 and 207 is shared with both first and second data sets, in like manner with the embodiment described above in connection with FIGS. 1 and Obviously, many other modifications and variations of the present invention are possible in light of the above teachings. It is therefore to be understood that within the scope of the disclosed inventive concept, the invention may be practiced otherwise than as specifically described.

What is claimed is:

1. An MR imaging method for measuring the parameter $T_2^*$ in a region of an imaging subject, said method comprising the steps of:

applying spatially selective rf excitation to said region to select an imaging slice taken through structures in said region;

implementing a spiral readout gradient waveform sequence with respect to said slice, said gradient waveform sequence generating a spiral trajectory, and including the generation of an early and a late echo separated by time in the same sequence following a single rf excitation pulse;

acquiring data from the start of the spiral trajectory to the end of the spiral trajectory;

sorting said data into data sets for early and late echo images, respectively; and calculating the signal intensity changes between the said early and late echo images respectively represented by said data sets to provide a measurement of $T_2^*$.

2. The method of claim 1 wherein:

said excitation step comprises applying a single spatially selective rf excitation pulse to said region; and data for the said early and late echo images are acquired in the same sequence following a single rf excitation pulse.

3. The method of claim 2 wherein:

said early echo occurs at the beginning of a data acquisition period, and said late echo occurs at the end of said acquisition period; and said early echo corresponds to the beginning of said spiral trajectory generated by said gradient waveform sequence, and said late echo corresponds to the end of said spiral trajectory generated by said gradient waveform sequence.

4. The method of claim 3 wherein:

a portion of said acquired data is common to both said data sets for said early and late echo images.

5. The method of claim 3 wherein:

said trajectory comprises a first trajectory portion which spirals outward from the center of k-space to a first maximum radius, and a second trajectory portion which spirals inward from a second maximum radius to said center.

6. The method of claim 5 wherein:

said first maximum radius and said second maximum radius coincide, and said first and second trajectory portions both spiral in the same direction.

7. The method of claim 5 wherein:

the path of said second trajectory portion coincides with the path of said first trajectory portion.

8. The method of claim 5 wherein:

said second maximum radius is the negative of said first maximum radius, and said first and second trajectory portions spiral in the same direction, said second trajectory portion being substantially interleaved with said first trajectory portion.

9. The method of claim 5 wherein:

said second maximum radius is the negative of said first maximum radius, and said first and second trajectory portions spiral in opposite directions, the first and second trajectory portions being in full interleaved relationship with each other.

10. The method of claim 3 wherein:

said measurement of $T_2^*$ is made for assessment of a selected physiologic parameter of said subject.

11. The method of claim 10 wherein:

said measurement of $T_2^*$ is made for assessment of perfusion in said subject by measuring $T_2^*$ when the subject is at a first state, and repeating said measurement of $T_2^*$ when the subject is at a second state.

* * * * *